(12) United States Patent
Sarigiannis et al.

(10) Patent No.: US 7,368,382 B2
(45) Date of Patent: *May 6, 2008

(54) ATOMIC LAYER DEPOSITION METHODS

(75) Inventors: Demetrius Sarigiannis, Boise, ID (US);
Garo J. Derderian, Boise, ID (US);
Cem Basceri, Boise, ID (US); Gurtej S. Sandhu, Boise, ID (US); F. Daniel Gealy, Kuna, ID (US); Chris M. Carlson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/413,438

(22) Filed: Apr. 28, 2006

(65) Prior Publication Data

US 2006/0205227 A1     Sep. 14, 2006

Related U.S. Application Data

(60) Division of application No. 10/863,048, filed on Jun. 7, 2004, which is a continuation of application No. 10/222,282, filed on Aug. 15, 2002, now Pat. No. 6,753,271.

(51) Int. Cl.
*H01L 21/44* (2006.01)
(52) U.S. Cl. .................. 438/680; 427/585; 257/E21.17
(58) Field of Classification Search ............... 438/680; 427/585
See application file for complete search history.

(56) References Cited

U.S. PATENT DOCUMENTS

| | | |
|---|---|---|
| 5,225,032 A | 7/1993 | Golecki |
| 5,879,459 A | 3/1999 | Gadgil et al. |
| 5,925,411 A | 7/1999 | van de Ven et al. |
| 5,972,430 A | 10/1999 | DiMeo, Jr. et al. |
| 6,015,597 A | 1/2000 | David |
| 6,174,377 B1 | 1/2001 | Doering et al. |
| 6,197,120 B1 | 3/2001 | David |

(Continued)

FOREIGN PATENT DOCUMENTS

WO    WO 01/27347 A1    4/2001

(Continued)

OTHER PUBLICATIONS

U.S. Appl. No. 10/132,003, Dando.

(Continued)

*Primary Examiner*—Alexander Ghyka
(74) *Attorney, Agent, or Firm*—Wells St. John P.S.

(57) ABSTRACT

The invention includes an atomic layer deposition method of forming a layer of a deposited composition on a substrate. The method includes positioning a semiconductor substrate within an atomic layer deposition chamber. On the substrate, an intermediate composition monolayer is formed, followed by a desired deposited composition from reaction with the intermediate composition, collectively from flowing multiple different composition deposition precursors to the substrate within the deposition chamber. A material adheres to a chamber internal component surface from such sequentially forming. After such sequentially forming, a reactive gas flows to the chamber which is different in composition from the multiple different deposition precursors and which is effective to react with such adhering material. After the reactive gas flowing, such sequentially forming is repeated. Further implementations are contemplated.

10 Claims, 2 Drawing Sheets

U.S. PATENT DOCUMENTS

| | | |
|---|---|---|
| 6,200,893 B1 | 3/2001 | Sneh |
| 6,270,572 B1 | 8/2001 | Kim et al. |
| 6,287,965 B1 | 9/2001 | Kang et al. |
| 6,301,434 B1 | 10/2001 | McDiarmid et al. |
| 6,305,314 B1 | 10/2001 | Sneh et al. |
| 6,355,561 B1 | 3/2002 | Sandhu et al. |
| 6,387,185 B2 | 5/2002 | Doering et al. |
| 6,391,785 B1 | 5/2002 | Satta et al. |
| 6,403,156 B2 | 6/2002 | Jang et al. |
| 6,426,307 B2 | 7/2002 | Lim |
| 6,451,119 B2 | 9/2002 | Sneh et al. |
| 6,451,695 B2 | 9/2002 | Sneh |
| 6,468,924 B2 | 10/2002 | Lee et al. |
| 6,475,276 B1 | 11/2002 | Elers et al. |
| 6,475,286 B1 | 11/2002 | Frijlink |
| 6,475,910 B1 | 11/2002 | Sneh |
| 6,482,262 B1 | 11/2002 | Elers |
| 6,482,476 B1 | 11/2002 | Liu |
| 6,534,395 B2 | 3/2003 | Werkhoven et al. |
| 6,585,823 B1 | 7/2003 | Van Wijck |
| 6,586,343 B1 | 7/2003 | Ho et al. |
| 6,589,886 B2 | 7/2003 | Kim et al. |
| 6,590,251 B2 | 7/2003 | Kang et al. |
| 6,602,784 B2 | 8/2003 | Sneh |
| 6,613,587 B1 | 9/2003 | Carpenter et al. |
| 6,613,695 B2 | 9/2003 | Pomarede et al. |
| 6,620,253 B1 | 9/2003 | Dando et al. |
| 6,620,723 B1 | 9/2003 | Byun |
| 6,630,401 B2 | 10/2003 | Sneh |
| 6,638,862 B2 | 10/2003 | Sneh |
| 6,664,192 B2 | 12/2003 | Satta et al. |
| 6,673,701 B1 | 1/2004 | Marsh et al. |
| 6,696,157 B1 | 2/2004 | David |
| 6,696,368 B2 | 2/2004 | Derraa et al. |
| 6,720,027 B2 | 4/2004 | Yang et al. |
| 6,727,169 B1 | 4/2004 | Raaijmakers et al. |
| 6,730,367 B2 * | 5/2004 | Sandhu ................ 427/553 |
| 6,746,952 B2 | 6/2004 | Derraa et al. |
| 6,753,271 B2 * | 6/2004 | Sarigiannis et al. ........ 438/785 |
| 6,821,347 B2 | 11/2004 | Carpenter et al. |
| 2001/0024387 A1 | 9/2001 | Raaijmakers et al. |
| 2001/0041250 A1 | 11/2001 | Werkhoven et al. |
| 2001/0050039 A1 | 12/2001 | Park |
| 2001/0054381 A1 | 12/2001 | Umotoy et al. |
| 2002/0086111 A1 | 7/2002 | Byun et al. |
| 2002/0108570 A1 | 8/2002 | Lindfors |
| 2002/0108714 A1 | 8/2002 | Doering et al. |
| 2002/0173054 A1 | 11/2002 | Kim |
| 2002/0173130 A1 | 11/2002 | Pomerede et al. |
| 2002/0187256 A1 | 12/2002 | Elers |
| 2003/0031807 A1 | 2/2003 | Elers et al. |
| 2003/0032281 A1 | 2/2003 | Werkhoven et al. |
| 2003/0082307 A1 | 5/2003 | Chung et al. |
| 2003/0085424 A1 | 5/2003 | Bryant et al. |
| 2003/0108674 A1 * | 6/2003 | Chung et al. ......... 427/255.394 |
| 2003/0129826 A1 | 7/2003 | Werkhoven et al. |
| 2003/0143328 A1 | 7/2003 | Chen et al. |
| 2003/0183171 A1 | 10/2003 | Sneh et al. |
| 2004/0033688 A1 | 2/2004 | Sarigiannis et al. |
| 2004/0083959 A1 | 5/2004 | Carpenter et al. |
| 2004/0137728 A1 | 7/2004 | Gallagher et al. |
| 2005/0037597 A1 | 2/2005 | Nguyen et al. |
| 2006/0265100 A1 | 11/2006 | Li |

FOREIGN PATENT DOCUMENTS

| | | |
|---|---|---|
| WO | WO 01/29280 A1 | 4/2001 |
| WO | WO 01/29893 A1 | 4/2001 |
| WO | WO 01/66832 A2 | 9/2001 |
| WO | WO 2004/011693 A1 | 2/2004 |

OTHER PUBLICATIONS

U.S. Appl. No. 10/132,767, Dando.
U.S. Appl. No. 10/150,388, Mardian et al.
U.S. Appl. No. 10/163,689, Derderian et al.
U.S. Appl. No. 10/208,314, Castrovillo et al.
U.S. Appl. No. 10/222,304, Sarigiannis et al.

* cited by examiner

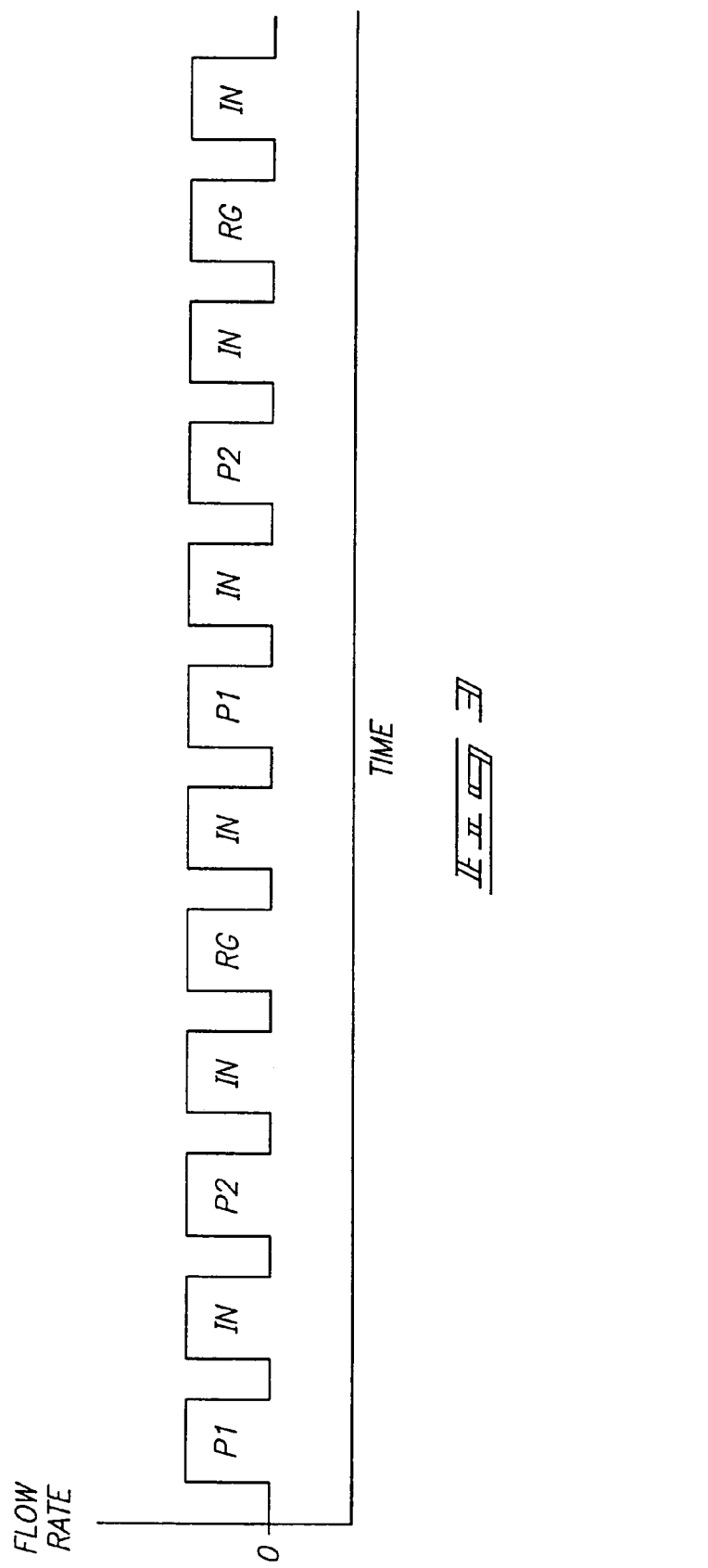

ATOMIC LAYER DEPOSITION METHODS

RELATED PATENT DATA

This patent resulted from a divisional application of U.S. patent application Ser. No. 10/863,048, filed Jun. 7, 2004, entitled "Atomic Layer Deposition Methods", naming Demetrius Sarigiannis, Garo J. Derderian, Cern Basceri, Gurtej S. Sandhu, F. Daniel Gealy and Chris M. Carlson as inventors, which is a continuation application of U.S. patent application Ser. No. 10/222,282, filed Aug. 15, 2002, entitled "Atomic Layer Deposition Methods", naming Demetrius Sarigiannis, Garo J. Derderian, Cem Basceri, Gurtej S. Sandhu, F. Daniel Gealy and Chris M. Carlson as inventors, now U.S. Pat. No. 6,753,271, issued Jun. 22, 2004, the disclosures of which are incorporated by reference.

TECHNICAL FIELD

This invention relates to atomic layer deposition methods.

BACKGROUND OF THE INVENTION

Semiconductor processing in the fabrication of integrated circuitry typically includes the deposition of layers on semiconductor substrates. One such method is atomic layer deposition (ALD) which involves the deposition of successive monolayers over a substrate within a deposition chamber typically maintained at subatmospheric pressure. With typical ALD, successive mono-atomic layers are adsorbed to a substrate and/or reacted with the outer layer on the substrate, typically by successive feeding of different deposition precursors to the substrate surface.

Atomic layer depositions are typically conducted within chambers or reactors which retain a single substrate upon a wafer holder or susceptor. The chambers include internal walls and other internal components which can undesirably have deposition product deposited thereupon in addition to the substrate. One existing method of protecting or preserving the internal chamber walls and other components is to shield such from the deposition material with one or more removable liners or shields. The liners might be received immediately adjacent or against the internal chamber walls or other surfaces. Alternately, the liners might be displaced from the wall or other surfaces, thereby defining an appreciably reduced volume chamber, or subchamber, within which the substrate is received for deposition. One advantage of using liners and shields is that they can be periodically replaced with new or cleaned liners, thereby extending the life of the deposition chambers and components therein. Further and regardless, the spent liners and shields can typically be removed and replaced much more quickly than the time it would take to clean the internal chamber walls and other components at given cleaning intervals.

An exemplary ALD method includes feeding a single vaporized precursor to a deposition chamber effective to form a first monolayer over a substrate received therein. Thereafter, the flow of the first deposition precursor is ceased and an inert purge gas is flowed through the chamber effective to remove any remaining first precursor which is not adhering to the substrate from the chamber. Subsequently, a second vapor precursor different from the first is flowed to the chamber effective to form a second monolayer on/with the first monolayer. The second monolayer might react with the first monolayer. Additional precursors can form successive monolayers, or the above process can be repeated until a desired thickness and composition layer has been formed over the substrate.

It is a desired intent or effect of the purging to remove unreacted gas or reaction by-products from the chamber to provide a clean reactive surface on the substrate for the subsequent precursor. In the context of this document, a reaction by-product is any substance (whether gas, liquid, solid or mixture thereof which results from reaction of any deposition precursor flowing to the chamber and that is not desired to be deposited on the substrate. Further in the context of this document, an intermediate reaction by-product or reaction intermediate by-product is a reaction by-product formed by less than desired complete reaction of a precursor to form a desired monolayer on the substrate. Where there is a great degree of varying topography and/or there are high aspect ratio features on the substrate, it can be difficult to move the unreacted gases or reaction by-products from deep within openings for ultimate removal from the chamber. Further, certain reaction by-products, particularly intermediate reaction by-products, may not be gaseous and may not completely react to form gaseous reaction by-products in the typical short precursor pulse times. Accordingly, the purge gas pulse may not be effective or sufficient in removing such intermediate reaction by-products from the substrate and chamber.

For example, consider that in an atomic layer deposition of titanium nitride using $TiCl_4$ and $NH_3$, the desired deposition product is TiN with HCl gas being the desired principle gaseous by-product. Consider also that there might be reaction intermediate by-products which might, even if gaseous, be difficult to remove from substrate openings. Further, if certain reaction intermediate by-products are solid and/or liquid phase prior to HCl formation, complete removal can be even more problematic where less than complete reaction to TiN and HCl occurs.

Consider also the atomic layer deposition of $Al_2O_3$ using trimethylaluminum (TMA) and ozone as alternating deposition precursors. Apparently in such deposition, achieving an effective ozone precursor feed can be somewhat of a challenge due to the limited lifetime of ozone within the chamber. Specifically, an ozone molecule is in an inherently unstable, reactive form of oxygen which can rapidly dissociate and/or combine with another ozone molecule to form three $O_2$ molecules. Regardless, a desired goal in the ozone feed is to result in oxygen atoms from the $O_3$ bonding to the surface of the substrate with $O_2$ as the reaction by-product which is driven off. Of course, the $O_2$ which forms deep within openings on the substrate has to be removed therefrom while more $O_3$ needs to get into the openings to desirable form a complete monolayer of oxygen atoms adhered and projecting from the substrate. In other words, the $O_2$ which forms is trying to get out while more $O_3$ is desirably trying to get in.

While the invention was motivated in addressing the above issues and improving upon the above-described drawbacks, it is in no way so limited. The invention is only limited by the accompanying claims as literally worded (without interpretative or other limiting reference to the above background art description, remaining portions of the specification or the drawings) and in accordance with the doctrine of equivalents.

SUMMARY

The invention includes an atomic layer deposition method of forming a layer of a deposited composition on a substrate. The method includes positioning a semiconductor substrate within an atomic layer deposition chamber. On the substrate, an intermediate composition monolayer is formed, followed by a desired deposited composition from reaction with the intermediate composition, collectively from flowing multiple different composition deposition precursors to the substrate within the deposition chamber. A material adheres to a chamber internal component surface from such sequential forming. After such sequential forming, a reactive gas flows to the chamber which is different in composition from the multiple different deposition precursors and which is effective to react with such adhering material. After the reactive gas flowing, such sequential forming is repeated.

Further implementations are contemplated.

BRIEF DESCRIPTION OF THE DRAWINGS

Preferred embodiments of the invention are described below with reference to the following accompanying drawings.

FIG. 3 is a diagrammatic depiction of flow versus time of one atomic layer deposition process in accordance with an aspect of the invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

An atomic layer deposition method in accordance with an aspect of the invention includes positioning a semiconductor substrate within an atomic layer deposition chamber. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

An intermediate composition monolayer is formed on the substrate from one or more deposition precursors flowed to the substrate within the deposition chamber. Then, one or more different composition deposition precursors is flowed to the substrate within the deposition chamber effective to react with the first monolayer and form a monolayer comprising a desired deposited composition of the ultimate layer being formed, with "desired" herein referring to at least at this point in time with respect to the preferred method. In other words, such deposited layer might be subsequently annealed, implanted, exposed to plasma, or otherwise processed in a manner which does not significantly modify its overall composition. Any deposition precursor gases are contemplated whether existing or yet-to-be developed. By way of example only where a desired ultimate deposition product or layer is TiN, exemplary different composition precursors include $TiCl_4$ or $NH_3$ to deposit a TiN comprising layer. Further by way of example only where the ultimate layer or product being formed is to be $Al_2O_3$, exemplary different composition deposition precursors include trimethylaluminum and ozone. Further by way of example only, an exemplary first monolayer intermediate composition utilizing $TiCl_4$ would include titanium or a titanium complex, whereas with respect to $NH_3$ such would at least include nitrogen. With respect to trimethylaluminum, the first monolayer intermediate composition would include an aluminum complex, and with ozone typically adhered oxygen atoms. Any suitable temperature, pressure, flow rate or other operating parameters, with or without plasma, can be selected and optimized by the artisan, of course, with no particular set of the same being preferred or constituting a part of the invention.

Figure 1:
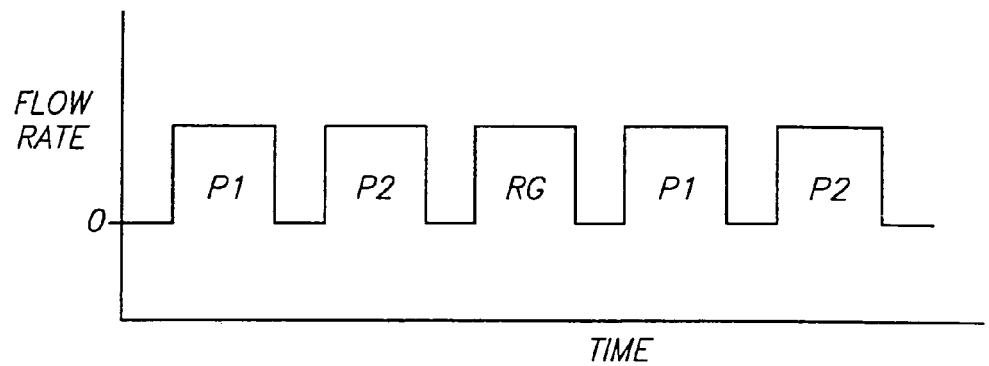
FIG. 1 is a diagrammatic depiction of flow versus time of one atomic layer deposition process in accordance with an aspect of the invention.

By way of example only, FIG. 1 depicts an exemplary plot of flow rate versus time of but one process in accordance with an aspect of the invention. A first precursor gas is flowed to the substrate within the atomic layer deposition chamber effective to form a first monolayer on the substrate. Such is designated by a precursor flowing P1. After forming the first monolayer of intermediate composition on the substrate, a second precursor gas, different in composition from the first precursor gas, is flowed to the substrate within the deposition chamber effective to react with the first monolayer and form a monolayer comprising the desired deposited composition. Such second precursor gas flowing is designated by P2. The particular lengths and rates of the respective flowings, and the times therebetween, can also be optimized by the artisan, of course, and do not constitute material or preferred aspects of the inventions disclosed herein. Further, the exemplary FIG. 1 and other figure depictions contemplate any processing occurring before or after the depicted flowings, including any additional processing intermediate the respective gas pulses, unless such is specifically precluded by the particular claim under analysis as literally worded, without interpretative or limiting reference to the background art description, remaining portions of the specification or the drawings, and yet in accordance with the doctrine of equivalents.

In the course of one or both of the above-described precursor flowings, some material may adhere to a chamber internal component surface. In the context of this document, a "chamber internal component surface" comprises any surface of hardware received within the deposition chamber that is subjected to multiple processings of semiconductor substrates within the chamber. Examples include an actual internal wall surface of the chamber, a surface of a chamber liner apparatus which forms a deposition subchamber within the chamber, and a surface of a portion of a substrate support received internally of the chamber walls.

By way of example only, the adhering material might be derived totally or at least primarily from a deposition precursor flow which forms the intermediate composition monolayer. Alternately by way of example only, such material might be derived totally or at least primarily from a deposition precursor flow which reacts with the intermediate composition monolayer and forms the desired deposited composition. The adhering material and the intermediate composition might be of a common composition relative one another or of different composition. The material might also adhere to the substrate within the chamber which is the focus of the deposition, although the invention is principally directed to contending with material which adheres to chamber internal component surfaces. Further by way of example only, and during the formation of the intermediate composition monolayer, intermediate reaction by-product might be formed, for example in any of gaseous, liquid and deposited states. Such adhering material might be of common composition with one or more of the intermediate reaction by-products, or be different in composition from all intermediate reaction by-products.

In one non-limiting consideration, such adhering material might be reactive with one or a multiple of the deposition precursors. In such event, it might be desirable to remove such adhering material from the substrate so it will not react with subsequent flowing precursor, or at least in some way passivate such adhering material to preclude its reaction with subsequently flowing deposition precursors. Further by way of example only, the adhering material might result, in part, from the reaction of deposition precursor with material of the chamber internal component surface, thus forming material adhering thereto. Such might constitute a monolayer or eventually considerably thicker layers from the successive formation of repeated monolayers.

By way of example only, an exemplary adhered material might comprise oxygen atoms adhering to a metal internal surface of a deposition chamber. Such could manifest by the feeding of ozone in any of the above-described exemplary processes involving the deposition of $Al_2O_3$. Alternately by way of example only, such might encompass any of $TiCl_2$, $TiCl_3$ and $NH_3$ complexes with respect to $TiCl_4$ and $NH_3$ deposition precursor flows.

After forming at least the initially desired deposited composition of the layer being formed, a reactive gas is flowed to the chamber which is different in composition from the multiple different deposition precursors effective to react with the adhering material. Further in one preferred embodiment, such reactive gas flowing preferably occurs prior to forming any further monolayer on the substrate.

In one aspect, the reactive gas reacts to modify the composition of the adhering material, with such modified composition material adhering to the chamber internal component surface(s). By way of example only, and where the adhering material comprises TiCl, $TiCl_2$ and/or $TiCl_3$, an exemplary reactive gas would be $O_2$ to modify the adhering material composition to $TiO_2$, which still adheres to the chamber internal component surface.

In one aspect, the reactive gas reacts to effectively remove the adhered material, and any reaction by-product thereof, from adhering to the chamber internal component surface. For example and by way of example only, where the adhering material comprises TiCl, $TiCl_2$ and/or $TiCl_3$, an exemplary reactive gas includes $Cl_2$, which would effectively etch or otherwise vaporize the adhering material from the substrate (i.e., to $TiCl_4$) and be exhausted from the chamber.

In one aspect, the reactive gas is not capable under conditions of the reactive gas flowing of reaction with the desired deposited composition. In one aspect, and under conditions of the reactive gas flowing, the reactive gas is capable of reaction with the intermediate composition, and regardless of whether any intermediate composition is exposed during the reactive gas flowing, either on the substrate or on any chamber internal component surface.

The conditions (i.e., temperature, pressure, flow rate, etc.) of the reactive gas flowing can be optimized by the artisan and are not otherwise particularly germane or preferred to any aspect of the invention. By way of example only, such conditions might be the same as, or different from, any of a first precursor gas flow, a second precursor gas flow and/or inert purge gas flow. In one aspect, the reactive gas flow is plasma-enhanced, for example either by plasma generation within the chamber, plasma generation remote of the chamber, or both.

The particular reactive gas selected, whether a single constituent or a mixture of constituents, will depend as a minimum upon at least some portion or component of the adhering material which will be capable of reaction with the reactive gas under conditions of the reactive gas flowing. By way of example only, possible reactive gases components include $Cl_2$, $O_2$ and $H_2$. For example and by way of example only where the adhering material comprises oxygen atoms, such might be removed in the presence of $O_2$ to form ozone and/or with $H_2$ to form $H_2O$ which is exhausted from the chamber.

Figure 2:
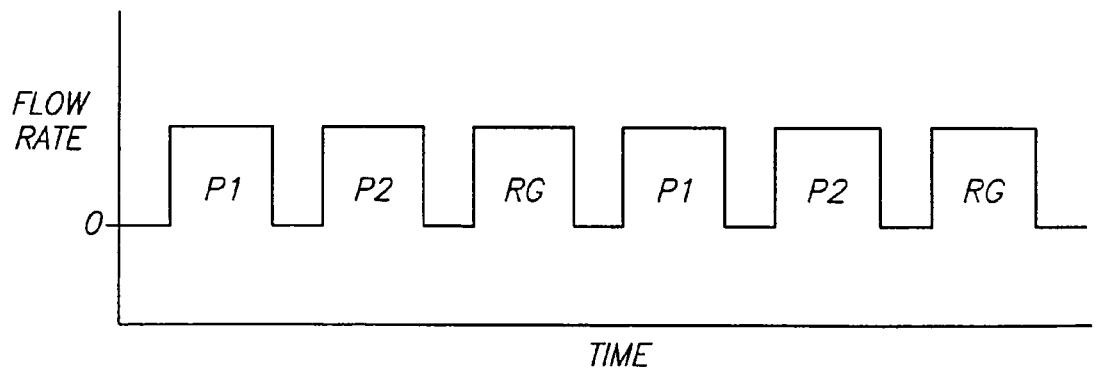
FIG. 2 is a diagrammatic depiction of flow versus time of one atomic layer deposition process in accordance with an aspect of the invention.

FIG. 1 depicts an exemplary such reactive gas flowing in the form of a discrete pulse RG. After the reactive gas flowing, the sequential forming is repeated, whereby an intermediate composition monolayer is formed, then a desired deposited composition from reaction with the intermediate composition collectively from flowing multiple different composition deposition precursors to the substrate within the deposition chamber. FIG. 1 depicts such exemplary processing by subsequent P1 and P2 pulsings. In one preferred embodiment, thereafter the reactive gas flowing is repeated (FIG. 2). Further in one aspect, the repeating of one or both of the sequential formings, as just so stated, and/or the reactive gas flowing, are sequentially repeated multiple times. Further in one aspect, the invention contemplates repeating the sequentially forming multiple times and repeating the reactive gas flowing only periodically after a plurality of consecutive sequential forming repetitions. In other words, such reactive gas flowing does not necessarily occur intermediate each desired deposited composition monolayer forming, but rather after multiple formings thereof.

Further more typically and preferably, inert gas flows are interposed between some or all of the respective deposition precursor and reactive gas flowings. By way of example only, such is depicted in FIG. 3. There illustrated is a two-sequence repetition, with inert gas flows being indicated by IN and which are interposed between the respective precursor and reactive gas flows.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of atomic layer deposition of materials on a substrate within a deposition chamber, comprising the acts of:
   alternately introducing a first precursor and a second precursor into said chamber, wherein said first precursor forms a first layer on said substrate, and wherein said second precursor is different from said first precursor and forms a second layer on said substrate, wherein a residue is formed within said chamber;
   interrupting said alternating introduction of said first and second precursors to purge said chamber, wherein said purge of said chamber is performed by introducing a third gas which is reactive with said residue, and wherein said purge removes at least a portion of said residue from said chamber; and
   resuming the alternately introducing the first precursor and second precursor into said chamber.

2. The method of claim 1 wherein said alternating introduction of said first and second precursors is interrupted at periodic intervals.

3. The method of claim 2 wherein said periodic intervals comprise after each introduction of said second precursor.

4. The method of claim 1 wherein said second layer reacts with said first layer to form a layer of a desired composition.

5. The method of claim 1 wherein said third gas is different from said first gas and said second gas.

6. The method of claim 1 wherein the third gas comprises $Cl_2$.

7. The method of claim 1 wherein the third gas comprises $O_2$.

8. The method of claim 1 wherein the third gas comprises $H_2$.

9. The method of claim 1 wherein the residue comprises oxygen atoms.

10. A method of forming material layers on a substrate within a deposition chamber, comprising the steps of:

sequentially introducing multiple precursors into said chamber and flowing said precursors. to an exposed surface of said substrate, each precursor being sufficiently reactive with the exposed surface of said substrate at the time each said precursor is flowed to said substrate to form a new exposed surface of a different composition than prior to the time each said precursor was flowed to said substrate, wherein during said step of sequentially introducing different precursors into said chamber a material is formed on internal surfaces of said chamber; and at least once during said step of introducing multiple precursors, interrupting the introducing of said precursors to purge said chamber, wherein said purge includes the flowing of at least one gas through said chamber, said gas selected to be reactive with said material on internal surfaces of said chamber, and wherein said flow of said selected gas through said chamber removes at least a portion of said material from said internal surfaces of said chamber, and wherein after said purge step is completed, said sequential introducing step is resumed.

* * * * *

UNITED STATES PATENT AND TRADEMARK OFFICE
CERTIFICATE OF CORRECTION

| | | |
|---|---|---|
| PATENT NO. | : 7,368,382 B2 | Page 1 of 1 |
| APPLICATION NO. | : 11/413438 | |
| DATED | : May 6, 2008 | |
| INVENTOR(S) | : Sarigiannis et al. | |

It is certified that error appears in the above-identified patent and that said Letters Patent is hereby corrected as shown below:

In column 7, line 21, in Claim 10, delete "precursors." and insert -- precursors --, therefor.

Signed and Sealed this

Nineteenth Day of August, 2008

JON W. DUDAS
*Director of the United States Patent and Trademark Office*